(12) United States Patent
Mahajan

(10) Patent No.: US 9,960,207 B1
(45) Date of Patent: May 1, 2018

(54) SPIN-SELECTIVE ELECTRON RELAY

(71) Applicant: GLOBALFOUNDRIES Inc., Grand Cayman (KY)

(72) Inventor: Sunit S. Mahajan, Halfmoon, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days. days.

(21) Appl. No.: 15/292,445

(22) Filed: Oct. 13, 2016

(51) Int. Cl.
| | |
|---|---|
| H01L 43/02 | (2006.01) |
| H01L 27/22 | (2006.01) |
| H01L 43/08 | (2006.01) |
| H01L 43/10 | (2006.01) |
| H01L 43/12 | (2006.01) |

(52) U.S. Cl.
CPC ............ H01L 27/228 (2013.01); H01L 43/02 (2013.01); H01L 43/08 (2013.01); H01L 43/10 (2013.01); H01L 43/12 (2013.01)

(58) Field of Classification Search
CPC ..... H01L 27/222; H01L 27/228; H01L 43/02; H01L 43/08; H01L 43/10; H01L 43/12; G11C 11/161
See application file for complete search history.

(56) References Cited

U.S. PATENT DOCUMENTS

| | | | |
|---|---|---|---|
| 7,453,084 B2 | 11/2008 | Nowak et al. | |
| 7,652,315 B2 | 1/2010 | Saito et al. | |
| 8,054,677 B2 * | 11/2011 | Zhu | B82Y 25/00 257/421 |
| 2008/0239588 A1 * | 10/2008 | Takashita | B82Y 10/00 360/324.1 |
| 2009/0224341 A1 * | 9/2009 | Li | B82Y 25/00 257/421 |
| 2016/0027999 A1 | 1/2016 | Pinarbasi | |
| 2016/0035584 A1 | 2/2016 | Hara et al. | |

OTHER PUBLICATIONS

Michael Ofstedahl, "What is STT-MRAM?" EE|Times Aug. 11, 2014 [retrieved from the internet http://www.eetimes.com/author.asp?section_id=368,doc_id=1323466].

Ikeda et al., "A Perpendicular-anistropy CoFeB—MgO Magnetic Tunnel Junction", Nature Material 9, 721-724 (2010) abstract only.

Tehrani, et al., "Recent Developments in Magnetic Tunnel Junction MRAM", IEEE Transactions on Magnetics, vol. 36, No. 5, Sep. 2000.

Pandharpure, Shrinivas, "Process development for integration of CoFeB/MgO-based magnetic tunnel junction (MTJ) device on silicon" (2007). Thesis. Rochester Institute of Technology. [retrieved from the internet http://scholarworks.rit.edu/theses/7219].

(Continued)

*Primary Examiner* — Stephen W Smoot
(74) *Attorney, Agent, or Firm* — Thompson Hine LLP; Anthony Canale

(57) ABSTRACT

Structures including a spin torque transfer magnetic tunnel junction (MTJ) stack and methods for fabricating same. A first contact is coupled with a first portion of a free layer of the MTJ stack, and a second contact is coupled with a second portion of the free layer of the MTJ stack. The free layer is laterally arranged between the first contact and the second contact.

20 Claims, 2 Drawing Sheets

(56) References Cited

OTHER PUBLICATIONS

Munira et al., "Chapter 67—Material Issues for Efficient Spin Transfer Torque RAMs", 11th IEEE International Conference on Nanotechnology, Aug. 15-19, 2011.
Wang et al., "Tunnel Junction with Perpendicular Magnetic Anisotropy: Status and Challenges", Micromachines 2015, 6(8), 1023-1045.
Song et al. "Investigation of atomic layer deposition of magnesium oxide on a CoFeB layer for three-dimensional magnetic tunneling junctions" Journal of Alloys and Compounds, vol. 588, Mar. 5, 2014, pp. 716-719 (abstract only).

\* cited by examiner

SPIN-SELECTIVE ELECTRON RELAY

BACKGROUND

The present invention relates to integrated circuits and semiconductor device fabrication and, more specifically, to structures that include a spin-torque-transfer magnetic tunnel junction stack and methods for fabricating such structures.

Magnetic random access memory (MRAM) is a non-volatile computer memory technology based on magnetoresistance. Because MRAM is non-volatile, MRAM can maintain memory content when the memory device is not powered. In an MRAM, data is stored by magnetoresistive elements made from a pinned magnetic layer and a free magnetic layer, each of which holds a magnetization. The magnetization of the pinned layer is fixed in its magnetic orientation, and the magnetization of the free layer can be changed by an external magnetic field generated by a programming current. In particular, the external magnetic field can cause the magnetic orientations of the magnetic layers to either be parallel, giving a lower electrical resistance across the layers ("0" state), or antiparallel, giving a higher electrical resistance across the layers ("1" state). The switching of the magnetic orientation of the free layer and the resulting high or low resistance states across the magnetic layers provide for the write and read operations of the MRAM cell.

A spin-torque-transfer MRAM (STT-MRAM) cell may include a magnetoresistive data-storing element in the form of a magnetic tunnel junction (MTJ) that includes a pinned magnetic layer, a free magnetic layer, and an insulating layer between the magnetic layers. The STT-MRAM cell further includes an access transistor, and is coupled with a bit line, a word line, and a source line. A programming current typically flows through the access transistor and the magnetic cell stack. The pinned magnetic layer polarizes the electron spin of the programming current, and torque is created as the spin-polarized current passes through the MTJ. The spin-polarized electron current interacts with the free magnetic layer by exerting a torque on the free magnetic layer. When the torque of the spin-polarized electron current passing through the MTJ is greater than a critical switching current density, the torque exerted by the spin-polarized electron current is sufficient to switch the magnetization of the free magnetic layer. Thus, the magnetization of the free magnetic layer can be aligned to be either parallel or antiparallel to the pinned layer, and the resistance state across the MTJ is changed.

Improved structures including a spin-torque-transfer magnetic tunnel junction stack and methods for fabricating such structures are needed.

SUMMARY

According to an embodiment of the invention, a device structure includes a magnetic tunnel junction (MTJ) stack with a free layer, a first contact coupled with a first portion of the free layer, and a second contact coupled with a second portion of the free layer. The free layer is arranged laterally between the first contact and the second contact.

According to another embodiment of the invention, a method includes forming a magnetic tunnel junction (MTJ) stack including a free layer, forming a first contact coupled with a first portion of the free layer, and forming a second contact coupled with a second portion of the free layer. The free layer is arranged laterally between the first contact and the second contact.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
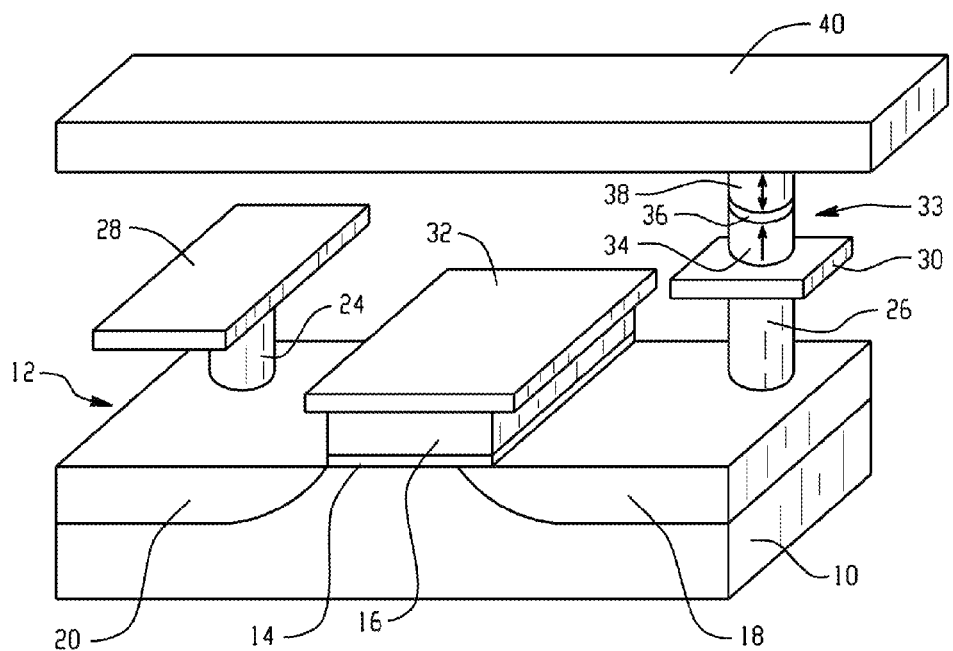
FIG. 1 is a perspective view of a spin-torque-transfer magnetic random access memory (STT-MRAM) cell at an initial stage of a processing method in accordance with embodiments of the invention and in which a dielectric layer of a metallization level that includes the magnetic tunnel junction (MTJ) stack is omitted for clarity of description.
Figure 2:
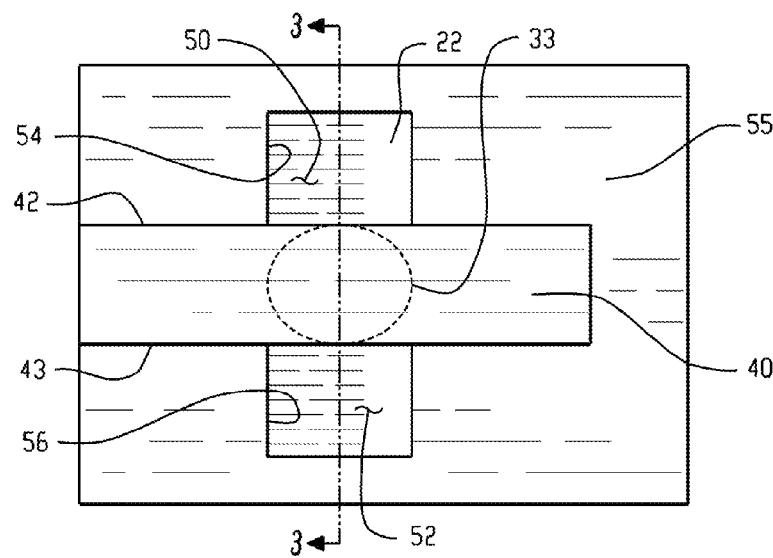
FIG. 2 is a top view of the STT-MRAM cell of FIG. 1 and in which the dielectric layer of the metallization level that includes the MTJ stack is included.
Figure 3:
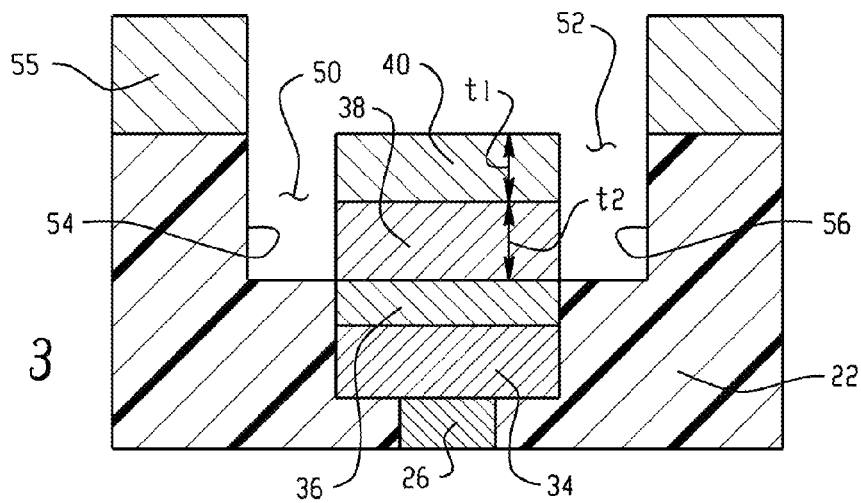
FIG. 3 is a cross-sectional view taken generally along line 3-3 in FIG. 2.

With reference to FIGS. 1-3 and in accordance with embodiments of the invention, a substrate 10 comprises a single-crystal semiconductor material usable to form the devices of an integrated circuit. The substrate 10 may be a bulk wafer, a bulk wafer that includes an epitaxial layer at its top surface, or the device layer of a silicon-on-insulator wafer. A field-effect transistor 12 is formed by front-end-of-line (FEOL) processing using complementary metal oxide semiconductor (CMOS) processes to process the substrate 10 and may constitute part of an integrated circuit of a chip.

The field-effect transistor 12 includes a gate dielectric layer 14 and a gate electrode 16 functioning as a gate structure that is positioned on the top surface of the substrate 10 with the gate dielectric layer 14 positioned between the gate electrode 16 and the substrate 10. The gate electrode 16 may be comprised of a metal, a silicide, polycrystalline silicon (e.g., polysilicon), combinations of these materials, or any other appropriate conductor(s) deposited by physical vapor deposition (PVD), chemical vapor deposition (CVD), etc. The gate dielectric layer 14 may be comprised of any suitable dielectric or insulating material including, but not limited to, silicon dioxide, silicon oxynitride, a high-k dielectric material such as hafnium oxide, or layered combinations of these dielectric materials, deposited by CVD, atomic layer deposition (ALD), etc. The gate dielectric layer 14 and gate electrode 16 may be formed from a layer stack of their constituent materials applied on the top surface of the substrate 10, and then patterning using photolithography and etching processes. The etching process, which may be a wet chemical etch or a dry etch, may rely on one or more etch chemistries that remove the constituent materials selective to the semiconductor material constituting the substrate 10. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

The field-effect transistor 12 includes a source 18 and a drain 20 that may be formed in the substrate 10. The source 18 and drain 20 of the field-effect transistor 12 may have an opposite conductivity type from the channel separating the source 18 from the drain 20. In an embodiment, source 18 and drain 20 may comprise semiconductor material of the substrate 10 that is heavily doped with an n-type dopant (e.g., phosphorus (P) or arsenic (As)). The field-effect transistor 12 may include other components such as halo regions, lightly-doped drain (LDD) regions, etc. in the substrate 10.

An interconnect structure includes a representative metallization level that may be formed by a middle-of-line (MOL) or back-end-of-line (BEOL) process on the substrate 10 following the completion of FEOL processing. Additional metallization levels (not shown) of the interconnect structure may be formed either above the metallization level. Conductive features in the different metallization levels function to interconnect devices of an integrated circuit and may provide circuit-to-circuit connections, or may establish contacts with input and output terminals.

The representative metallization level includes a dielectric layer 22 (FIGS. 2, 3), contacts 24, 26, a source line 28 coupled by the contact 24 with the source 18 of the field-effect transistor 12, a pad 30 coupled by the contact 26 with the drain 20 of the field-effect transistor 12, and a word line 32 coupled with the gate electrode 16 of the field-effect transistor 12. The contacts 24, 26, source line 28, pad 30, and word line 32 are embedded in the dielectric layer 22 as conductive features. The dielectric layer 22 may be comprised of an electrically-insulating dielectric material, such as an oxide of silicon (e.g., silicon dioxide ($SiO_2$)) deposited by CVD or a low-k dielectric material characterized by a relative permittivity or dielectric constant that is less than the dielectric constant of silicon dioxide ($SiO_2$). The contacts 24, 26 may be comprised of a conductor, such as a metal like tungsten (W) or copper (Cu), and may be clad with a conductive liner (e.g., titanium nitride (TiN)). The source line 28, pad 30, and word line 32 may be comprised of a conductor, such as copper (Cu), formed by subtractive etching or by a damascene process.

A magnetic tunnel junction (MTJ) stack, generally indicated by reference numeral 33, is located on the pad 30 within the dielectric layer 22 of the metallization level and defines a spin torque transfer magnetic random access memory (STT-MRAM) cell in combination with the field-effect transistor 12. The MTJ stack 33 includes a magnetically fixed or fixed layer 34, a tunnel barrier layer 36, and a magnetically free layer 38. The magnetization or magnetic orientation of the fixed layer 34 is fixed or pinned to a particular direction while the magnetization or magnetic orientation of the free layer 38 may be switched based on an applied current density and direction. In particular, the magnetization of the free layer 38 may be programmed to be aligned in a direction parallel to the magnetization of the fixed layer 34, or in a direction antiparallel to the magnetization the fixed layer 34, depending on a direction of the write current to the MTJ stack 33. Because of increased tunneling across the tunnel barrier layer 36 in the parallel state, the electrical resistance across the tunnel barrier layer 36 between the free layer 38 and the fixed layer 34 in the parallel state is greater than the electrical resistance across the tunnel barrier layer 36 between the free layer 38 and the fixed layer 34 in the antiparallel state. The comparatively high and low electrical resistances define two distinct memory states capable of storing binary data. In an embodiment, the MTJ stack 33 may be a perpendicular MTJ in which the magnetizations are perpendicular to the layer thicknesses and the height of the MTJ stack 33, as opposed to the width of the MTJ stack 33.

The fixed layer 34 may be a layer stack that includes one or more magnetic layers comprised of, for example, a cobalt-iron-boron (CoFeB) alloy or a cobalt-iron (CoFe) alloy deposited by PVD. The magnetization of the fixed layer 34 is pinned such that the magnetization cannot flip (i.e., rotate) in the presence of an applied magnetic field and thereby acts as a fixed reference. The tunnel barrier layer 36 is comprised of a non-magnetic and electrically insulating layer, such as magnesium oxide (MgO) or aluminum oxide ($Al_2O_3$). The free layer 38 may also be comprised of an alloy magnetic layer or a multilayer that includes one or more layers of, for example, a cobalt-iron-boron (CoFeB) alloy or a cobalt-iron (CoFe) alloy, or a nickel-iron (NiFe) alloy. The MTJ stack 33 may include top and bottom electrodes (not shown) comprised of a conductive material such as tantalum (Ta) or tantalum nitride (TaN).

The MTJ stack 33 uses principles of spin transfer torque to effectuate a change in the direction of magnetization of the free layer 38. To that end, the field-effect transistor 12 causes a spin polarized current to flow vertically through the MTJ stack 33. When electrons flow across the MTJ stack 33 in a direction from the fixed layer 34 to the free layer 38, spin torque from these electrons orientates the magnetization of the free layer 38 in a direction that is parallel to the magnetization of the fixed layer 34. When electrons flow across the MTJ stack 33 in a direction from the free layer 38 to the fixed layer 34, spin torque from electrons that are reflected from the fixed layer 34 back into the free layer 38 orientates the magnetization of the free layer 38 to be anti-parallel relative to the magnetization of the fixed layer 34. Thus, controlling the direction of the electron (current) flow causes switching of the direction of magnetization of the free layer 38 and the associated resistance changes between low and high states based on the magnetization of the free layer 38, i.e. parallel versus anti-parallel, relative to that of the fixed layer 34. The switch in the magnetization direction of the free layer 38 may be used to program/write/erase the STT-MRAM cell that includes the MTJ stack 33.

The STT-MRAM cell that includes field-effect transistor 12 and MTJ stack 33 may be arranged in rows and columns with other similar STT-MRAM cells to define a memory array. Each column includes a bit line 40 and the source line 28 that provide a bidirectional current path for reading and writing data values to one or more STT-MRAM cells of the column. Similar to the source line 28, pad 30, and word line 32, the bit line 40 may be comprised of a conductor, such as copper (Cu), formed by subtractive etching or by a damascene process, and embedded in the dielectric layer 22. The word line 32 is coupled to a particular row of STT-MRAM cells in a row to enable the STT-MRAM cells in that row to be selected for data read and write operations.

Vias 50, 52 may be formed in the dielectric layer 22 by photolithography and etching at a location positioned relative to the MTJ stack 33. The MTJ stack 33 may be arranged laterally between vias 50, 52 with the via 50 is adjacent to a side edge 42 of the free layer 38 and bit line 40 and the via 52 is adjacent to an opposite side edge 43 of the free layer 38 and bit line 40. To form the vias 50, 52, a resist layer 55 may be applied, exposed to a pattern of radiation projected through a photomask, and developed to form an open area that is aligned with the MTJ stack 33 and extends outward from the opposite side edges 42, 43. The patterned resist layer 55 is used as an etch mask for a dry etching process, such as a reactive-ion etching (RIE), that removes portions of the dielectric layer 22 to form the vias 50, 52. The etching process may be conducted with an etch chemistry that removes the material of the dielectric layer 22 selective to at least the materials of the bit line 40 and the free layer 38.

The bit line 40 has a thickness t1 and the free layer 38 has a thickness t2 measured from its interface with the tunnel barrier layer 36 to its interface with the bit line 40. The bit line 40 has a top surface that may be coplanar with the top surface of dielectric layer 22. These thicknesses are related to their deposited layer thicknesses and may be equal to their deposited layer thicknesses. The vias 50, 52 have respective sidewalls 54, 56 that extend from the top surfaces of the dielectric layer 22 and the bit line 40 into the dielectric layer 22. The free layer 38 may have a single sidewall that extends about its circumference so that different portions of the sidewall are generally aligned with the side edges 42, 43, or may have multiple sidewalls such that different sidewalls are generally aligned with the side edges 42, 43. The sidewalls 54 of the via 50 and the sidewalls 56 of the via 52 are located adjacent to the exterior of the sidewall(s) of the free layer 38 and penetrate past the top surface of the free layer 38 without intersecting the top surface, which is covered at least in part by the bit line 40.

The bit line 40 and free layer 38 are arranged laterally between the via 50 and the via 52, whereas the fixed layer 34, tunnel barrier layer 36, the free layer 38, and bit line 40 are stacked with a vertical arrangement. The sidewalls 54 of the via 50 and the sidewalls 56 of the via 52 may penetrate to a depth relative to the top surface of the dielectric layer 22 that is less than or equal to the sum of the thicknesses of the free layer 38 and bit line 40. In an embodiment, the sidewalls 54 of the via 50 and the sidewalls 56 of the via 52 may penetrate to a depth that is equal to the sum of the thicknesses of the free layer 38 and bit line 40 such that the vias 50, 52 penetrate to a depth that is shallower than the depth of an interface between the free layer 38 and the tunnel barrier layer 36. The sidewalls 54, 56 are connected by a horizontal surface at the base of each of the vias 50, 52.

Figure 4:
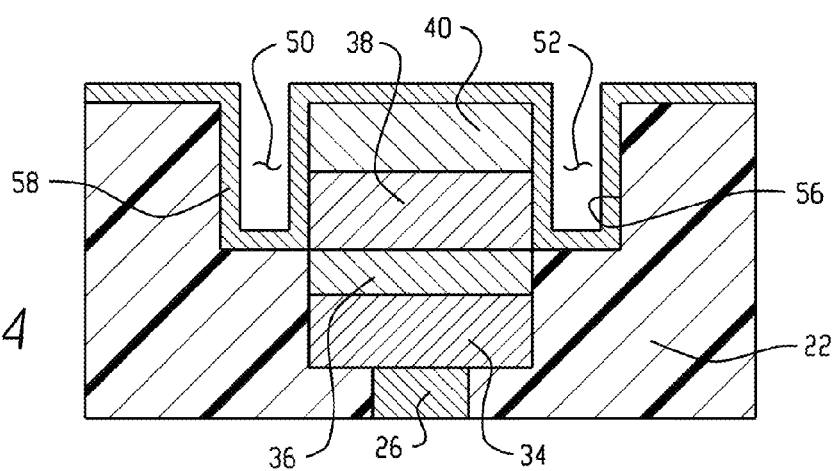
FIG. 4 is a cross-sectional view at a stage of the processing method subsequent to FIG. 3.

With reference to FIG. 4 in which like reference numerals refer to like features in FIGS. 1-3 and at a subsequent fabrication stage, the resist layer 55 may be stripped from the top surface of the dielectric layer 22 after the dielectric layer 22 is etched to form the vias 50, 52. A dielectric layer 58 may be comprised of a thin layer of an electrical insulator that may be conformally formed by atomic layer deposition (ALD) and that is a non-magnetic material. The thickness of the dielectric layer 58 may be uniform at all locations on the sidewalls 54 and base of each of the vias 50, 52, and also forms on the top surface of the dielectric layer 22.

Figure 5:
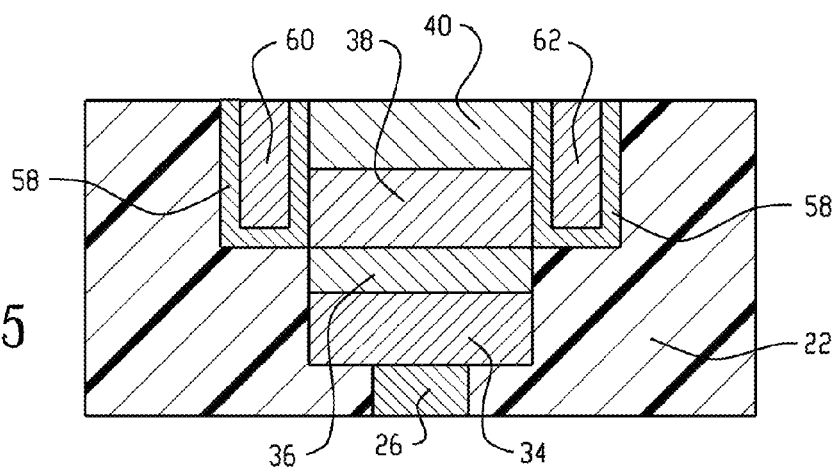
FIG. 5 is a cross-sectional view at a stage of the processing method subsequent to FIG. 4.

With reference to FIG. 5 in which like reference numerals refer to like features in FIG. 4 and at a subsequent fabrication stage, contacts 60, 62 are respectively formed in the vias 50, 52 and adopt the shapes of the respective vias 50, 52. The contacts 60, 62 may be formed by depositing a layer of the constituent material that fills the vias 50, 52 and also forms in the field area on the top surface of dielectric layer 22. The material may be removed from the field area by planarization, such as with etch back and/or chemical mechanical polishing (CMP), which leaves the contacts 60, 62 as embedded structures in the dielectric layer 22.

The contacts 60, 62 are coupled with different portions of the free layer 38 and are electrically isolated from the free layer 38 by respective intervening portions of the dielectric layer 58, which operate as non-magnetic dielectric spacers between the contacts 60, 62 and the free layer 38. Portions of the dielectric layer 58 also electrically isolate the contacts 60, 62 from the bit line 40. The dielectric layer 58 in the field area on the top surface of dielectric layer 22 may also be removed by CMP. The contacts 60, 62, which are located adjacent to the different side edges 42, 43 such that the free layer 38 is located horizontally (i.e., laterally) between contact 60 and the contact 62, are electrically isolated from each other by the dielectric layer 22 and the dielectric layer 58. The bit line 40 is connected to a top surface of the free layer 38 from vertically above the MTJ stack 33, whereas the contacts 60, 62 are connected in a lateral direction to a sidewall of the free layer 38.

The contacts 60, 62 may be comprised of a magnetic material such as, for example, a cobalt-iron-boron (CoFeB) alloy or a cobalt-iron (CoFe) alloy deposited by PVD. The magnetization of the fixed layer 34 is polarized and pinned such that the magnetization cannot flip (i.e., rotate) in the presence of an applied magnetic field and, thereby, acts as a fixed reference.

The contacts 60, 62 and the MTJ stack 33 constitute a spin-sensitive electron switch or relay for controlling carrier flow in a lateral direction from one contact to the other contact. As discussed hereinabove, the field-effect transistor 12 operates to switch the spin-sensitive electron by changing the magnetization of the free layer 38. When the magnetization of the free layer 38 is parallel with the magnetization of the contacts 60, 62, a spin-polarized current may flow from one contact 60 to the other contact 62. When the magnetization of the free layer 38 is antiparallel with the magnetization of the contacts 60, 62, the electrical resistance for the path including the contacts 60, 62 and free layer 38 is greater than the electrical resistance when the respective magnetizations are parallel. For example, the variation in the electrical resistance between the parallel and antiparallel states of the magnetization may be 100% or more. In the antiparallel state, the spin-polarized current flowing from one contact 60 to the other contact 62 is greatly reduced or attenuated than when the magnetizations are parallel. For example, a spin-polarized current input at the contact 60 is attenuated to different levels when passing laterally through the free layer 38 dependent upon whether the magnetizations are parallel or antiparallel. The gain may be increased by cascading multiple spin-sensitive electron relays that include contacts identical to contacts 60, 62 and an MTJ stack identical to MTJ stack 33 in a series connection.

Additional processing follows that may include forming a metallization level of the interconnect structure having metallization coupled with the contacts 60, 62.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure comprising:
    a magnetic tunnel junction (MTJ) stack including a free layer;
    a bit line coupled with the free layer of the MTJ stack, the bit line having a first side edge and a second side edge opposite from the first side edge;
    a first contact coupled with a first portion of the free layer; and
    a second contact coupled with a second portion of the free layer,
    wherein the free layer is laterally arranged between the first contact and the second contact, the first contact is positioned adjacent to the first side edge of the bit line, and the second contact is positioned adjacent to the second side edge of the bit line.

2. The device structure of claim 1 wherein the MTJ stack further includes a fixed layer and a tunnel barrier layer between the free layer and the fixed layer, and further comprising:
    an access transistor coupled with the fixed layer of the MTJ stack.

3. The device structure of claim 2 wherein the access transistor includes a first source/drain region, the bit line is coupled with a third portion of the free layer of the MTJ stack, and further comprising:
    a contact coupling the first source/drain region with the fixed layer.

4. The device structure of claim 3 wherein the access transistor further includes a second source/drain region and a gate electrode, and further comprising:
    a word line coupled with the gate electrode; and
    a source line coupled with the second source/drain region.

5. The device structure of claim 1 wherein the MTJ stack is located between the first side edge of the bit line and the second side edge of the bit line.

6. The device structure of claim 1 further comprising:
    a first non-magnetic dielectric spacer between the first contact and the first portion of the free layer; and
    a second non-magnetic dielectric spacer between the second contact and the second portion of the free layer.

7. The device structure of claim 1 wherein the bit line is coupled with a third portion of the free layer that is located between the first portion of the free layer and the second portion of the free layer.

8. The device structure of claim 1 wherein the first contact and the second contact are comprised of a magnetic material that is capable of being magnetically polarized.

9. The device structure of claim 1 wherein the first contact and the second contact are comprised of a cobalt-iron-boron (CoFeB) alloy.

10. A device structure comprising:
    a magnetic tunnel junction (MTJ) stack including a free layer, a fixed layer, and a tunnel barrier layer between the free layer and the fixed layer;
    a first contact coupled with a first portion of the free layer;
    a second contact coupled with a second portion of the free layer; and
    an interconnect level including a dielectric layer,
    wherein the free layer is laterally arranged between the first contact and the second contact, the MTJ stack is located in the interconnect level, the first contact is located in a first via formed in the dielectric layer adjacent to an exterior of the free layer, the second contact is located in a second via formed in the dielectric layer adjacent to an exterior of the free layer, and the first via and the second via penetrate from a top surface of the dielectric layer to a depth in the dielectric layer that is shallower than a plane containing an interface between the free layer and the tunnel barrier layer.

11. The device structure of claim 10 wherein the MTJ stack is located between the first via and the second via.

12. The device structure of claim 10 further comprising:
    a bit line coupled with the free layer of the MTJ stack, the bit line having a first side edge and a second side edge opposite from the first side edge,
    wherein the first contact is positioned adjacent to the first side edge and the second contact is positioned adjacent to the second side edge.

13. The device structure of claim 10 wherein the first contact and the second contact are comprised of a cobalt-iron-boron (CoFeB) alloy.

14. A method comprising:
    forming a magnetic tunnel junction (MTJ) stack including a free layer;
    forming a bit line coupled with the free layer of the MTJ stack;
    forming a first contact coupled with a first portion of the free layer; and
    forming a second contact coupled with a second portion of the free layer,
    wherein the free layer is laterally arranged between the first contact and the second contact, the bit line has a first side edge and a second side edge opposite from the first side edge, the first contact is positioned adjacent to the first side edge of the bit line, and the second contact is positioned adjacent to the second side edge of the bit line.

15. The method of claim 14 wherein the MTJ stack includes a fixed layer, and further comprising:
    forming an access transistor that has a first source/drain region, a second source/drain region, and a gate electrode;
    forming a contact coupling the first source/drain region with the fixed layer of the MTJ stack;
    forming a word line coupled with the gate electrode; and forming a source line coupled with the second source/drain region.

16. The method of claim 14 further comprising:
forming a first non-magnetic dielectric spacer between the first contact and the first portion of the free layer; and
forming a second non-magnetic dielectric spacer between the second contact and the second portion of the free layer.

17. The method of claim 14 further comprising:
forming an interconnect level that includes a dielectric layer and the MTJ stack in the dielectric layer;
forming a first via in the dielectric layer adjacent to an exterior of the free layer; and
forming a second via in the dielectric layer adjacent to the exterior of the free layer.

18. The method of claim 17 wherein the MTJ stack is located between the first via and the second via.

19. The method of claim 17 wherein the MTJ stack further includes a fixed layer and a tunnel barrier layer between the free layer and the fixed layer, and the first via and the second via penetrate to a depth that is shallower than a plane containing an interface between the free layer and the tunnel barrier layer.

20. The method of claim 14 wherein the bit line is coupled with a third portion of the free layer that is located between the first portion of the free layer and the second portion of the free layer.

* * * * *